(12) United States Patent
Whitney et al.

(10) Patent No.: US 11,454,462 B2
(45) Date of Patent: Sep. 27, 2022

(54) HEAT DISSIPATING FIN WITH THERMOSIPHON

(71) Applicant: Aavid Thermalloy, LLC, Laconia, NH (US)

(72) Inventors: Bradley R. Whitney, Epsom, NH (US); Chad Turmelle, Pembroke, NH (US); Randolph H. Cook, Gilford, NH (US)

(73) Assignee: Aavid Thermalloy, LLC, Laconia, NH (US)

( * ) Notice: Subject to any disclaimer, the term of this patent is extended or adjusted under 35 U.S.C. 154(b) by 228 days.

(21) Appl. No.: 16/531,517

(22) Filed: Aug. 5, 2019

(65) Prior Publication Data

US 2021/0041191 A1 Feb. 11, 2021

(51) Int. Cl.
*F28F 13/06* (2006.01)
*F28D 15/02* (2006.01)

(52) U.S. Cl.
CPC .......... *F28F 13/06* (2013.01); *F28D 15/0283* (2013.01)

(58) Field of Classification Search
CPC ............... F28F 2215/12; F28F 15/0275; F28F 15/0233; F28F 15/0266; F28D 15/0275; F28D 15/0233; F28D 15/0266; F28D 15/0283
See application file for complete search history.

(56) References Cited

U.S. PATENT DOCUMENTS

| | | | | |
|---|---|---|---|---|
| 4,449,578 A | * | 5/1984 | Munekawa | F28D 15/0266 165/104.21 |
| 4,588,023 A | * | 5/1986 | Munekawa | F28D 15/0266 165/104.21 |
| 5,642,775 A | * | 7/1997 | Akachi | F28D 15/0233 165/104.14 |
| 6,097,597 A | | 8/2000 | Kobayashi | |
| 7,420,810 B2 | * | 9/2008 | Reis | C09K 5/041 165/104.26 |
| 8,109,323 B2 | * | 2/2012 | Lian | H01L 23/3672 165/80.3 |
| 8,913,386 B2 | | 12/2014 | Gradinger et al. | |
| 2005/0199376 A1 | * | 9/2005 | Lee | F28D 15/0233 165/104.26 |

(Continued)

FOREIGN PATENT DOCUMENTS

| | | |
|---|---|---|
| EP | 2 677 261 A1 | 12/2013 |
| KR | 10-2016-0064927 A | 6/2016 |
| WO | 2011/035943 A2 | 3/2011 |

OTHER PUBLICATIONS

Extended European Search Report for European Application No. 20161165.4, dated Sep. 8, 2020.

*Primary Examiner* — Devon Russell
(74) *Attorney, Agent, or Firm* — Wolf, Greenfield & Sacks, P.C.

(57) ABSTRACT

A heat transfer device such as a heat sink includes one or more fins for dissipating heat received from a heat source, such as an integrated circuit or other electronic component. A thermosiphon component including a tube that defines a closed, continuous loop and contains a working fluid is attached to a face of a corresponding fin and is arranged to operate as a two-phase thermosiphon to transfer heat across areas of the fin. The heat transfer may equalize temperatures across the fin, enhancing efficiency.

23 Claims, 7 Drawing Sheets

(56) References Cited

U.S. PATENT DOCUMENTS

| | | | |
|---|---|---|---|
| 2013/0025832 A1* | 1/2013 | Yang | F24S 10/504 |
| | | | 165/104.34 |
| 2013/0077245 A1* | 3/2013 | Gradinger | F28D 15/0266 |
| | | | 361/700 |
| 2013/0112372 A1 | 5/2013 | Moon | |
| 2013/0340978 A1* | 12/2013 | Agostini | F28D 15/0275 |
| | | | 165/104.21 |
| 2016/0076819 A1* | 3/2016 | Espersen | F28D 15/0266 |
| | | | 165/104.21 |
| 2018/0038653 A1* | 2/2018 | Espersen | F28D 1/05366 |
| 2018/0308780 A1* | 10/2018 | Tong | H01L 23/367 |
| 2020/0088479 A1* | 3/2020 | Tseng | F28F 13/10 |
| 2020/0183469 A1* | 6/2020 | Wang | H05K 7/20336 |

* cited by examiner

HEAT DISSIPATING FIN WITH THERMOSIPHON

BACKGROUND OF INVENTION

1) Field of Invention

This invention relates generally to heat transfer fins or other devices that employ a two-phase thermosiphon.

2) Description of Related Art

Thermosiphon devices are widely used for cooling systems, such as integrated circuits and other computer circuitry. For example, U.S. Patent Publication 2013/0104592, U.S. Pat. Nos. 6,097,597 and 8,913,386 disclose thermosiphon devices for cooling electronic components or other heat generating elements.

SUMMARY OF INVENTION

One aspect of the invention provides a heat transfer device includes a planar fin having first and second opposed faces and a heat receiving portion at an edge of the planar fin. At least one tube forming a continuous, closed loop and containing a working fluid may be physically and thermally connected to the first face of the planar fin so that heat may be transferred between the fin and tube. The at least one tube and working fluid may be adapted to operate as a two-phase thermosiphon in which working fluid is evaporated in an evaporation portion of the at least one tube adjacent the heat receiving portion of the planar fin, and working fluid vapor flows in the at least one tube away from the evaporation portion for condensing. Thus, the at least one tube and working fluid may aid in transferring heat from relatively hotter areas of the fin to relatively cooler areas, thereby improving efficiency of the fin. This arrangement can be particularly useful with fins made of relatively thin and/or relatively lower thermal conductance, such as aluminum sheet materials. Accordingly, in some embodiments, the at least one tube may be arranged to equalize a temperature of the planar fin at the heat receiving portion with temperatures of the planar fin in areas away from the heat receiving portion.

In some embodiments, the at least one tube is adapted for flow of working fluid in only a single direction along the continuous, closed loop during operation, while in other embodiments the at least one tube is adapted for counterflow of working fluid in the continuous, closed loop during operation.

In some embodiments, the at least one tube includes a multiport tube having multiple flow channels. This may allow use of a tube that has a relatively thin wall thickness, but can withstand relatively high internal pressures. In some cases, the multiport tube has a linear array of the flow channels, and the multiport tube may be attached to the first face of the planar fin such that each flow channel in the linear array is adjacent the first face. A manifold portion may fluidly connect the multiple flow channels in two portions of the tube with each other, e.g., the manifold portion may physically connect ends of the tube together as well as provide a manifold chamber that permits fluid communication between flow channels. In some cases, the manifold portion is located on the continuous, closed loop where the working fluid is mostly in a liquid state, which may allow the flow channels to maintain about the same amount of liquid phase working fluid. In other cases, the manifold portion is located on the continuous, closed loop where the working fluid is mostly in a vapor state, which may allow for pressure equalization between flow channels. The manifold portion may be defined by a coupling that joins ends of the at least one tube to each other, e.g., the coupling may be formed by receiving a first end of the multiport tube into a second end of the multiport tube. In some embodiments, the planar fin includes an opening in which the manifold portion is positioned, which may allow the manifold portion to be at least partially recessed relative to the face of the fin to which the tube is attached. In some embodiments, the planar fin may include one or more openings to receive other components, such as electrical wiring or fasteners, and/or to permit air or other fluid flow through the opening, e.g., from a first face of the fin to the second face. In some embodiments, a coupling may include a tubular port arranged to allow evacuation of the continuous, closed loop of the tube and/or providing of working fluid to the loop. The tubular port may be secured to an opening of the coupling and have a channel that provides fluid communication between the tubular port and an interior space of the coupling. The tubular port may provide a stop for tube ends received into the coupling, and/or a leg of the tubular port that defines a channel may limit an extent to which the tubular port is extended into the coupling. The tubular port may include a stop to limit an extent to which the tubular port can be extended into or through the coupling.

In one embodiment, the planar fin has a rectangular shape with a first edge opposite a second edge and a third edge opposite a fourth edge. The heat receiving portion of the fin may be at the first edge of the rectangular shape, and the at least one tube may have a first portion that extends outwardly along the first edge toward the third and fourth edges, third and fourth portions that respectively extend along the third and fourth edges toward the second edge, and a second portion extends inwardly along the second edge. In some embodiments, the first portion of the tube at least in part defines the evaporation portion, and the at least one tube is arranged so that working fluid vapor flows in the at least one tube from the evaporation portion to the third and fourth portions, and flows from the third and fourth portions to the second portion. The at least one tube may be arranged such that condensed working fluid liquid flows in the at least one tube from the second portion to the third and fourth portions, and from the third and fourth portions to the first portion.

The heat transfer device may include a base that supports the planar fin and the at least one tube and transfers heat to the planar fin and the at least one tube. For example, the base may be in thermal communication with a heat source, such as an integrated circuit or other electronic device, and transfer heat from the heat source to the fin and tube. In some embodiments, the base includes a groove that receives at least a part of the first edge of the planar fin and the first portion of the at least one tube, e.g., so heat can be transferred directly from the base to the fin and tube. A fin may have one or more tubes attached to it, either on the first face or both faces, e.g., a first tube may be bonded to the first face of the planar fin, and a second tube may be bonded to the second face of the planar fin.

In some embodiments, the second portion of a tube has parts that extend inwardly from the third and fourth portions along the second edge of the fin at an angle relative to the second edge such that a central part of the second portion is located closer to the second edge than outer parts of the second portion. This may aid in gravity assisted flow of liquid in the second portion toward the third and fourth portions of the tube. In another embodiment, the second portion has parts that extend inwardly from the third and fourth portions along the second edge at an angle relative to the second edge such that a part of the second portion nearest the third portion is located closer to the second edge than a part of the second portion nearest the fourth portion. This may aid in gravity assisted flow of liquid in the second portion toward the fourth portion.

In some embodiments, the third and fourth portions may each have twist bends, e.g., a pair of 90/90 degree twist bends or 180/90 degree twist bends, and the third and fourth portions may be located away from the plane of the first face. Such twist bends may allow for various positioning and orientation of the third and fourth portions relative to the fin. For example, an intermediate part of the third and fourth portions between twist bends may be arranged in a plane parallel to the plane of the first face, e.g., to help reduce resistance or obstruction of flow between adjacent fins in an array. In other embodiments, the twist bends may position and orient parts of the third and fourth portions so as to block, occlude or resist flow between fins.

These and other aspects of the invention will be apparent from the following description. Also, it should be appreciated that different aspects of the invention may be combined in a variety of different ways.

BRIEF DESCRIPTION OF THE DRAWINGS

The accompanying drawings, which are incorporated in and form a part of the specification, illustrate select embodiments of the present invention and, together with the description, serve to explain the principles of the inventions. In the drawings.

DETAILED DESCRIPTION

Figure 1:
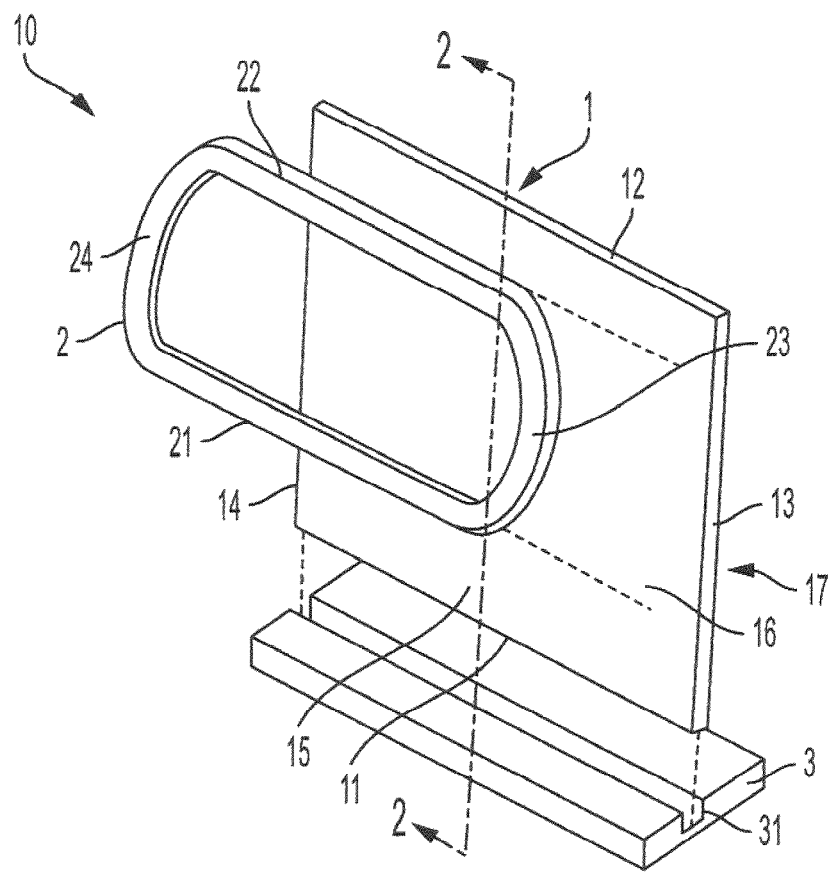
FIG. 1 is an exploded perspective view of a heat transfer device in an illustrative embodiment that incorporates aspects of the invention.

Aspects of the invention are not limited in application to the details of construction and the arrangement of components set forth in the following description or illustrated in the drawings. Other embodiments may be employed and aspects of the invention may be practiced or be carried out in various ways. Also, aspects of the invention may be used alone or in any suitable combination with each other. Thus, the phraseology and terminology used herein is for the purpose of description and should not be regarded as limiting.

Air-cooled heat sinks are commonly used to receive heat from a component, such as an integrated circuit or other electronic device, and dissipate or otherwise transfer the heat to surrounding air. Such heat sinks typically have a base that is in thermal communication with the heat source, and one or more fins that receive heat from the base and transfer the heat to surrounding air and/or other materials in the environment by convection and/or radiation. Air-cooled heat sink performance requirements often necessitate tall or otherwise large surface area heat dissipation fins to provide adequate surface area for the required level of heat dissipation. Non-thermal considerations like total material cost and the weight of the heat sink assembly often require that these heat sink fins be fabricated from relatively thin, lightweight, and inexpensive materials, such as sheet aluminum. Tall, thin aluminum fins may meet weight and cost targets, but may fail to meet thermal requirements. The limitation in terms of thermal performance for aluminum fins in this case is rooted in a low fin efficiency that a relatively tall and thin fin provides. Fin efficiency can be thought of as the fin's ability to convey heat to the upper portions of its height or otherwise to areas distant from a heat receiving area of the fin, e.g., where the fin is attached to the base. By definition, a fin of 100% efficiency is one whose temperature at areas most distant from a heat receiving area is equal to the temperature at the heat receiving area. For a simple solid fin made from sheet stock (e.g., a fin of rectangular cross-section), a designer can improve fin efficiency by specifying use of copper instead of aluminum. With all other things being equal, a heat sink with copper fins would operate at a higher fin efficiency than the same design with aluminum fins. The downside of specifying copper over aluminum is a significant increase in cost and weight, however. Similarly, the designer could specify thicker aluminum fins and thereby, all other things being equal, improve fin efficiency. Here again the downside is increased cost and weight of the thicker fins.

To enhance fin efficiency in a heat sink assembly while reducing cost and weight, the inventors have combined a relatively thin and inexpensive fin (e.g., made of a relatively low cost and lightweight material such as aluminum) with a thermosiphon component that acts to distribute heat across the fin. By making the temperature of different portions of the fin more uniform (i.e., equalizing temperatures across the fin such that the difference between the temperatures is less than would otherwise be), efficiency of the fin can be enhanced to levels that would otherwise require a more thermally conductive (and often more expensive and/or heavier) material or construction. FIG. 1 shows an illustrative embodiment of a heat transfer device 10, e.g., a heat sink assembly, that includes a fin 1 with a thermosiphon component 2 adapted to transfer heat from a heat receiving portion to other areas of the fin 1 so that temperatures of the different areas are more uniform than would be without the thermosiphon component 2. In this embodiment, the fin 1 has a planar body with first and second opposed faces 16, 17 and a heat receiving portion 15. The fin 1 in FIG. 1 is rectangular or quadrilateral in shape, and has a first edge 11 opposite a second edge 12, and a third edge 13 opposite a fourth edge 14, although fins with other shapes are possible. (It should be appreciated that as used herein, a "rectangular" fin need not be precisely or mathematically rectangular in shape, but rather may have edges 11-14 that are wavy or irregular in shape rather than being strictly linear, and sides of the fin need not meet to define a corner or with exactly a 90 degree angle.) The thermosiphon component includes a tube 2 that is physically and thermally connected to the first face 16 of the fin 1 so that heat can be transferred by conduction between the tube 2 and the fin 1. The tube 2 can be attached to the fin 1 by thermally conductive adhesive, welding, brazing, fasteners, clips, clamps or other arrangement. The tube 2 forms a continuous, closed loop and contains a working fluid so the tube 2 can operate as a two-phase thermosiphon in which working fluid can be evaporated in one portion of the tube (an evaporation portion) and evaporated vapor can flow away from the evaporation portion for condensing in other areas of the tube 2 (a condensing portion). In this manner, the tube 2 may move heat from the heat receiving portion 15 of the fin 1 to other areas of the fin 1. In the FIG. 1 embodiment, the fin 1 is thermally connected to a base 3, e.g., by fitting the first edge 11 of the fin 1 in a groove 31 of the base 3 so the fin 1 is physically supported by the base 3. The base 3 is arranged to be thermally coupled to a heat source, such as an electronic device (not shown), and so the base 3 can transfer heat from the heat source to the fin 1. The portion of the fin 1 nearest where heat is received from the base 3 is the heat receiving portion 15, and will generally have a higher temperature as compared to other areas of the fin 1 in the absence of the thermosiphon component. The tube 2 is arranged to receive heat in a first portion 21 (an evaporation portion) near the heat receiving portion 15 which evaporates working fluid in the tube 2. Evaporated working fluid is able to flow away from the first portion 21 to other portions of the tube, such as second, third and/or fourth portions 22-24, where vapor condenses back to liquid. The condensed working fluid can flow back toward the first portion 21 (by gravity) for later evaporation. This evaporation/condensation cycle moves heat from the heat receiving portion 15 of the fin 1 to other areas of the fin 1 away from the heat receiving portion 15 and thus helps to equalize temperatures across areas of the fin 1, thereby improving efficiency of the fin 1.

Figures 2, 3:
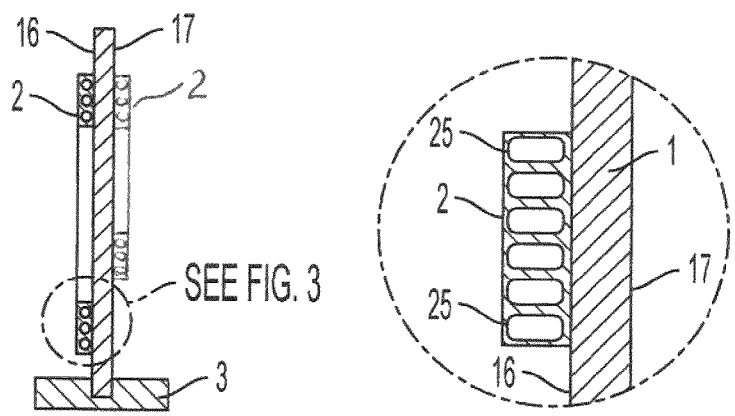
FIG. 2 is a cross sectional view along the line 2-2 in FIG. 1.
FIG. 3 is a close up view of the section labeled A in FIG. 2.

While the tube 2 may have a single flow channel in the closed loop, a tube 2 that includes multiple flow channels may provide improved performance with respect to tube structure in terms of ability to withstand internal pressure. This is due largely to the internal web(s) of the multiple flow channel tube. This improved structure allows for thinner tube walls, enabling designs of lower weight and lower cost. For example, FIG. 2 shows a cross sectional view along the line 2-2 in FIG. 1 and illustrates that the tube 2 is a multiport tube having a plurality of flow channels. As can be seen in the close up view of FIG. 3, the multiport tube 2 may have a linear array of flow channels 25, and the tube 2 may be attached to the fin 1 so that each of the flow channels 25 in the linear array is adjacent the first face 16 of the fin 1. It should be understood, however, that other arrangements are possible. The tube 2 may have a plurality of flow channels 25, but not necessarily all of the flow channels need be adjacent the face 16 of the fin 1. Instead, some flow channels 25 may be spaced from the face 16, e.g., separated from the face 16 by another flow channel 25 or an air gap. Also, flow channels 25 of a tube 2 need not be arranged in a linear array, but could be arranged in any suitable way. Moreover, while FIG. 1 shows an arrangement with one tube 2, two or more tubes 2 may be provided on a face 16 of the fin 1 (each tube having one or more flow channels), and/or one or more tubes 2 may be provided on both faces 16, 17 of the fin 1, e.g., as can be seen in FIG. 2.

Figure 4:
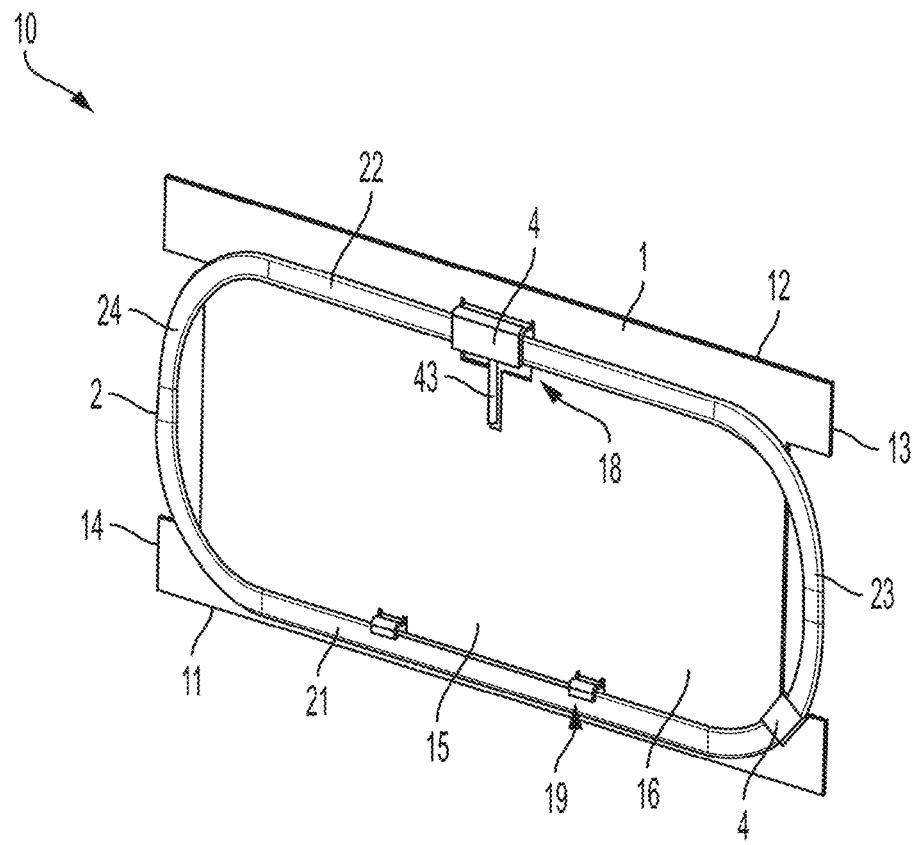
FIG. 4 is a perspective view of an embodiment including a fin and thermosiphon tube having a coupling in an upper section opposite a heat receiving portion of the fin.

In some embodiments, a thermosiphon component tube 2 may include a manifold that allows for fluid communication between flow channels 25 in a tube 2 or tubes 2. For example, FIG. 4 shows a heat transfer device 10 that includes a manifold 4 arranged at an upper portion of the tube 2. In this location, the manifold 4 is positioned on the continuous, closed loop of the tube 2 where the working fluid is mostly in a vapor state. As shown in the partial cut away view of FIG. 5, the manifold 4 includes a chamber 41 arranged so that each of the flow channels 25 of the tube 2 can fluidly communicate with each other. This may allow for pressure equalization between the flow channels 25 and/or other fluid communication, e.g., so each flow channel 25 has approximately a same amount of liquid form working fluid. The manifold 4 is not limited to being positioned on the closed loop of the tube 2 where working fluid is mostly in a vapor state, but may be positioned where the working fluid is mostly in a liquid state, such as at a location between the first portion 21 of the tube 2 and the third portion 23 as shown in FIG. 4. While the location of a manifold 4 in different areas of the closed loop of the tube 2 may provide for different operative effects, the manifold 4 also provides manufacturing benefits as it can be adapted to include a tube or other structure to serve as a port for evacuation of the loop and/or for injection of refrigerant or other working fluid into the loop. Also, a manifold 4 may be arranged to join multiple tubes 2 together, both physically and to provide fluid coupling between flow channels in the tubes 2. For example, multiple, single flow channel tubes 2 may be provided on a face of a fin 1, and ends of the tubes 2 may be coupled to a manifold 4.

In some embodiments, a coupling that joins ends of a tube 2 together may provide a manifold 4. In the FIG. 5 embodiment, the a sleeve-type coupling is arranged to receive opposite ends of the tube 2. The coupling may include stops at an inner space of the coupling to limit the insertion depth for the ends of the tube 2 so that the tube ends are separated from each other to define a suitable manifold chamber 41. In another embodiment shown in FIG. 6, a manifold 4 is defined by one end of the tube 2 which has been enlarged so that the other end of the tube 2 can be received within the enlarged end of the tube 2. Such relative enlargement can be formed by expanding the end of a tube, and/or swaging or otherwise reducing the size of the other end of the tube 2. A manifold chamber 41 may be defined by one of the tube ends, e.g., by cutting or otherwise removing portions of the separating walls or webs between flow channels 25, if the tube 2 is a multiport tube. Alternately, no manifold chamber 41 need be provided, and the webs between flow channels 25 of the receiving tube end may contact or otherwise meet corresponding webs from the received tube end (e.g., the webs in the tube portion on the right in FIG. 6 may be extended to the left so as to contact webs in the tube portion on the left in FIG. 6. This allows flow channels 25 to communicate, but without a manifold chamber 41. In another embodiment, ends of the tube 2 may be joined in a butt-joint where the opposed tube ends are positioned against each other and secured in a suitable way, such as by welding, brazing, adhesive, etc. Thus, no coupling need be provided, and a manifold 4 may be defined by interior spaces of the tube ends. As in the FIG. 6 embodiment, a manifold chamber 41 may be defined in a butt-type connection by removing walls or webs between flow channels 25 in one or both tube ends so a suitably sized manifold chamber 41 is provided. Or, no manifold chamber 41 need be provided and instead ends of the tube butt-joined so corresponding webs are in contact with each other.

Figure 5:
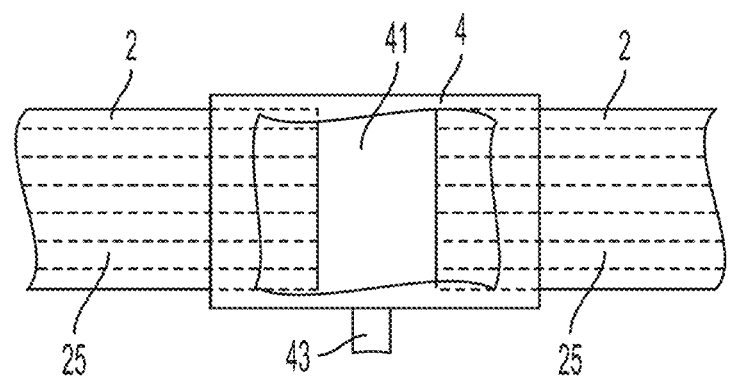
FIG. 5 is a partially cut away view of a tube manifold in an illustrative embodiment.
Figure 6:
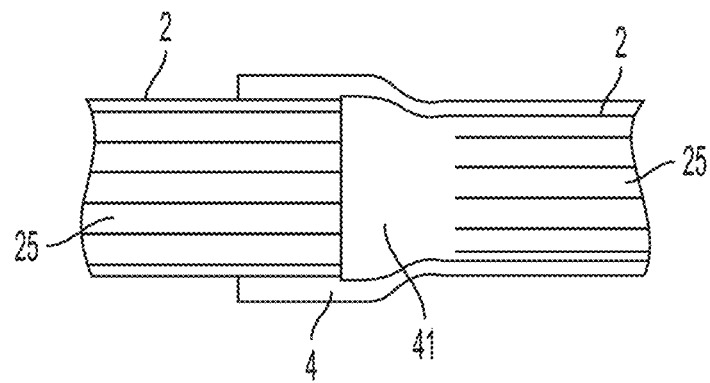
FIG. 6 is a sectional view of a tube manifold in an embodiment in which a tube end is formed to define a coupling part.

FIGS. 4 and 5 show that the coupling which forms the manifold 4 includes a fill port 43 for providing working fluid in the tube 2. That is, the tube 2 may be assembled with the coupling to provide a sealed loop for the working fluid, after which the tube 2 may be evacuated and working fluid provided to the tube interior via the fill port 43. The fill port 43 may be arranged in different ways, and more detail regarding illustrative embodiments is included below. In the embodiment of FIG. 4, the fill port 43 includes a conduit that extends from the coupling that allows liquid/vapor phase working fluid to be introduced into the tube 2 and then the fill port 43 sealed closed, such as by a plug, welding, crimping, etc. In some cases, the fill port 43 may be implemented as an opening into the continuous, closed loop of the tube 2, e.g., at a manifold 4, that can be sealed by a plug, welding, adhesive, etc.

FIG. 4 also shows that the fin 1 includes an opening 18 in which the manifold 4 is positioned. In cases where the manifold 4 is formed by a coupling or other element having a size larger than the tube ends joined to the coupling, the opening 18 may receive a portion of the coupling so that the tube 2 may suitably contact the face 16 of the fin 1. The fin 1 in FIG. 4 has other openings, which may provide different functions. For example, openings near the heat receiving portion 15 of the fin 1 are formed to define clips 19 used to secure a part of the tube 2 to the fin 1. Such clips or other similar features may be formed in other ways and in other areas of the fin 1. Also, notches or openings at the third and fourth edges 13, 14 of the fin 1 are arranged near the third and fourth portions 23, 24 of the tube 2. These openings may allow portions of the tube at the openings to be bent or otherwise offset so as to reduce resistance to air flow across the fins 1, e.g., in a right-to-left direction in FIG. 4. Openings 18 may be provided in the fin 1 in other areas and/or for other purposes, such as allowing electrical wiring to pass through the opening, fasteners or other components to be at least partially received into the opening 18, allowing air or other fluid flow through the opening 18 (e.g., from a first face 16 to a second face 17 of the fin 1), etc.

Figure 7:
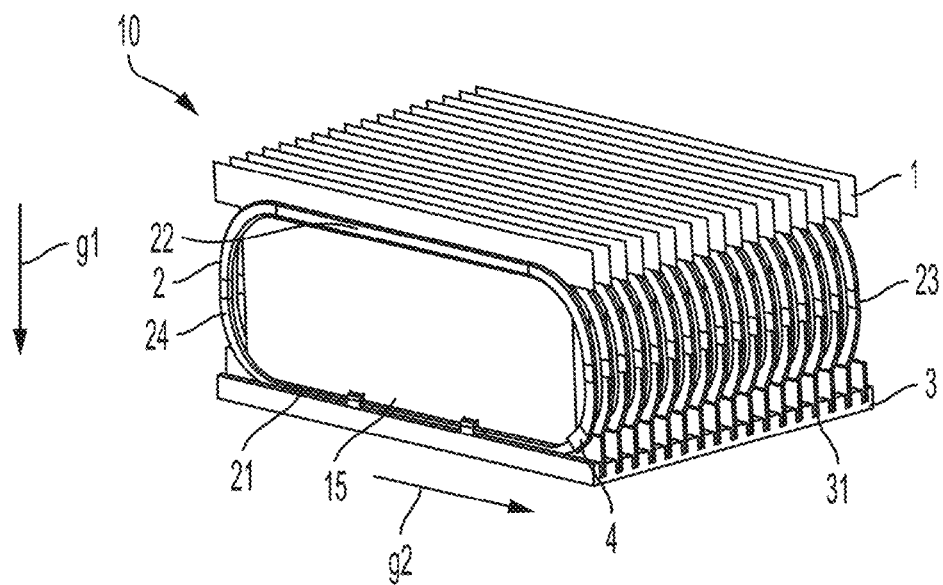
FIG. 7 is a perspective view of a heat transfer assembly including a plurality of fin and tube arrangements as in FIG. 4.
Figure 8:
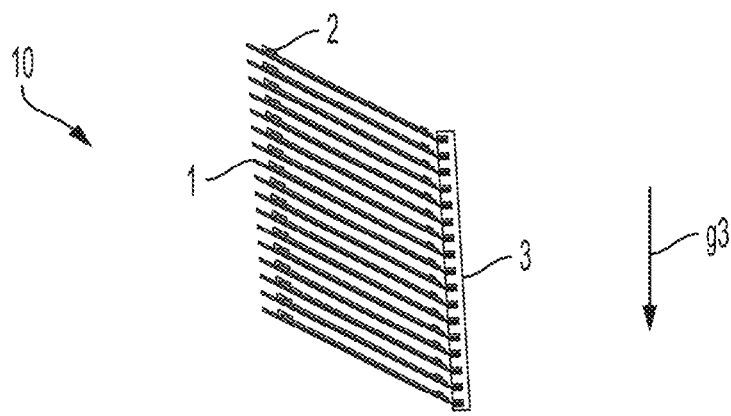
FIG. 8 is a side view of a heat transfer assembly in which a base is arranged vertically.

While the embodiments of FIGS. 1 and 4 are shown with a single fin 1, heat transfer devices 10 may include any suitable number of fins 1 and/or thermosiphon component tubes 2. For example, FIG. 7 shows a heat transfer device 10 that includes a base 3 with multiple grooves 31 that each receives a portion of one of a plurality fins 1 arranged similarly to that in FIG. 4. An air gap or space may be provided between adjacent fins 1 to allow air flow between the fins 1, e.g., in a direction parallel to the planes of the fins 1. Note that the grooves 31 in the base of FIG. 7 are arranged to receive a portion of a fin 1 as well as a portion of the tube 2. This may help transfer heat directly from the base 3 to the tube 2 and working fluid, but is not required. While the FIG. 7 embodiment is arranged to operate with the force of gravity oriented downwardly in the plane of the drawing of FIG. 7 and perpendicular to the generally horizontal planar base 3, i.e., along the arrow g1 in FIG. 7, other arrangements are possible. For example, the FIG. 7 embodiment could be reoriented with respect to the force of gravity arranged as shown by the arrow g2 in FIG. 7, i.e., so that the base 3 is oriented vertically with both the plane of the base 3 and the grooves 31 parallel to the force of gravity along arrow g2 and so that the third portions 23 of the tubes 2 and manifolds 4 are located below the fourth portions 24 of the tubes 2 (or vice versa). In another embodiment, FIG. 8 shows a side view of a heat transfer device 10 that is arranged similarly to the FIG. 7 embodiment, but is adapted to operate with the plane of the base 3 oriented vertically and parallel to the force of gravity along the arrow g3 and the grooves 31 of the base 3 oriented perpendicular to the force of gravity g3. In this embodiment of FIG. 8, each of the fins 1 (and as necessary, tubes 2) is bent so that portions of the fins 1 and tubes 2 that are farthest from the base 3 are located above portions of the fins 1 and tubes 2 that are nearest the base 3. In other words, in this embodiment, the fins 1 (and tubes 2 as necessary) are bent or otherwise formed so that the second portions 22 of the tubes 2 are positioned above corresponding first portions 21 of the tubes 2. This allows for the gravity-assisted flow of working fluid in the tubes 2.

Figure 9:
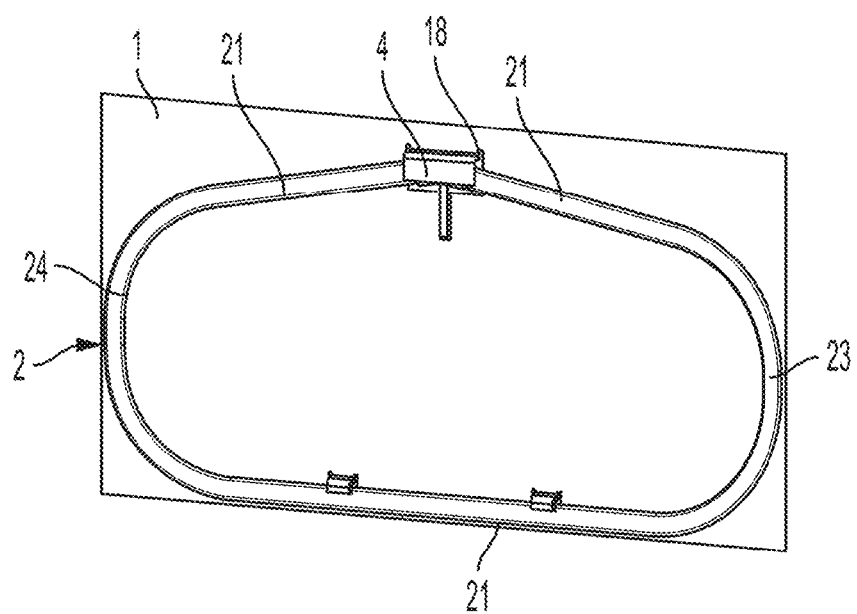
FIG. 9 is a perspective view of a fin and thermosiphon tube embodiment in which an upper portion of the tube has a peak near a center of the fin.

The embodiments of FIGS. 1 and 4 may be arranged so that working fluid moves in the closed loop of the tubes 2 in either a counterflow-type flow during operation, or so that the working fluid flows in only a single direction along the closed loop of the tubes 2. In a counterflow-type operation, working fluid liquid may be evaporated in the first portion 1 of the FIGS. 1 and 4 embodiments, and the evaporated vapor may flow outwardly along the first edge 11 of the fin 1 toward the third and fourth edges 13, 14 to the third and fourth portions 23, 24 of the tube 2. The vapor may flow upwardly in the third and fourth portions 23, 24 along the third and fourth edges 13, 14 of the fin 1, and then inwardly in the second portion 22 of the tube along the second edge 12 of the fin 1. The vapor may condense in the second portion 22 (and/or in the third and fourth portions 23, 24) of the tube 2, and the condensed liquid may flow outwardly in the second portion 22, and downwardly in the third and fourth portions 23, 24 to the first portion 21 of the tube. Since vapor and liquid flow in opposite directions in the tube 2, this type of operation is referred to as counterflow operation. In some embodiments, the fin 1 and/or tube 2 may be arranged to encourage counterflow operation, e.g., in a way like that in FIG. 9. The FIG. 9 embodiment is similar to that in FIGS. 1 and 4, except that the second portion 22 of the tube 2 has parts that extend inwardly from the third and fourth portions 23, 24 along the second edge 12 of the fin 1 at an angle relative to the second edge 12 such that a central part of the second portion 22 (e.g., at the manifold 4) is located closer to the second edge 12 than outer parts of the second portion 22. In other words, the second portion 22 of the tube 2 has a peak or apex near a center of the second portion 22 so that vapor is encouraged to flow upwardly toward the peak or apex (in this case at the manifold 4) and liquid is encouraged to flow downwardly away from the peak or apex toward the third and fourth portions 23, 24 of the tube. Thus, this type of shape of the tube 2 may help encourage counterflow operation of the thermosiphon component 2.

Figure 10:
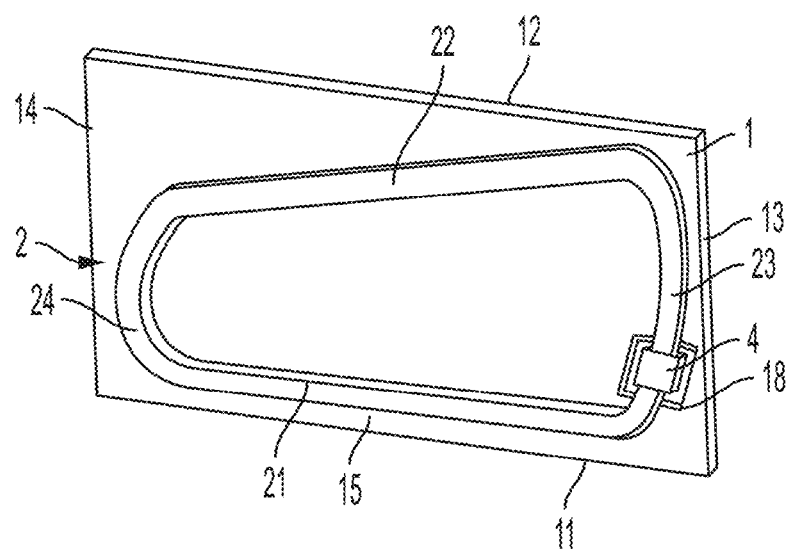
FIG. 10 is a perspective view of a fin and thermosiphon tube embodiment in which an upper portion of the tube has a peak near a side of the fin.

Embodiments like that in FIGS. 1 and 4 may also be adapted for flow of working fluid in only a single direction in the tube 2, e.g., only in a counterclockwise direction as viewed in FIGS. 1 and 4. In this case, evaporated working fluid in the first portion 21 would flow toward the third portion 23, then in the third portion 23 to the second portion 22. Vapor that condenses in the second portion 22 (i.e., liquid form working fluid) may flow toward the fourth portion 24 and then downwardly into the first portion 21 for evaporation again. While the description above indicates counterclockwise flow in the tubes 2 of FIGS. 1 and 4, flow in a clockwise direction is equally possible. Again, suitable arrangement of the fin 1 and/or tubes 2 may help encourage single direction loop flow of working fluid during operation. For example, FIG. 10 shows an embodiment in which an end of the second portion 22 adjacent the third portion 23 of the tube 2 is positioned higher than, or above, an end of the second portion 22 that is adjacent the fourth portion 24. This sloped arrangement of the second portion 22 (e.g., where the second portion 22 is arranged at an angle relative to the second edge of the fin 1) may help encourage downward and leftward flow of condensed liquid in the second portion 22, which may help encourage counterclockwise flow of working fluid in the tube 2. Although the second portion 22 of the tube in FIG. 10 has a linear shape, the second portion 22 may be curved, e.g., with a concave-up or concave-down curve or other shape.

Figure 11:
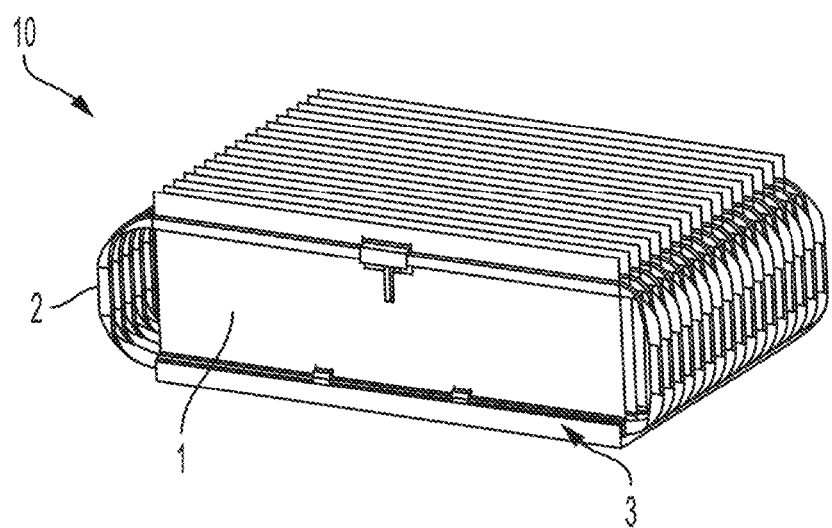
FIG. 11 is a perspective view of a heat transfer assembly including a plurality of fin and tube arrangements in which the tubes have twisted and bent side portions.
Figure 12:
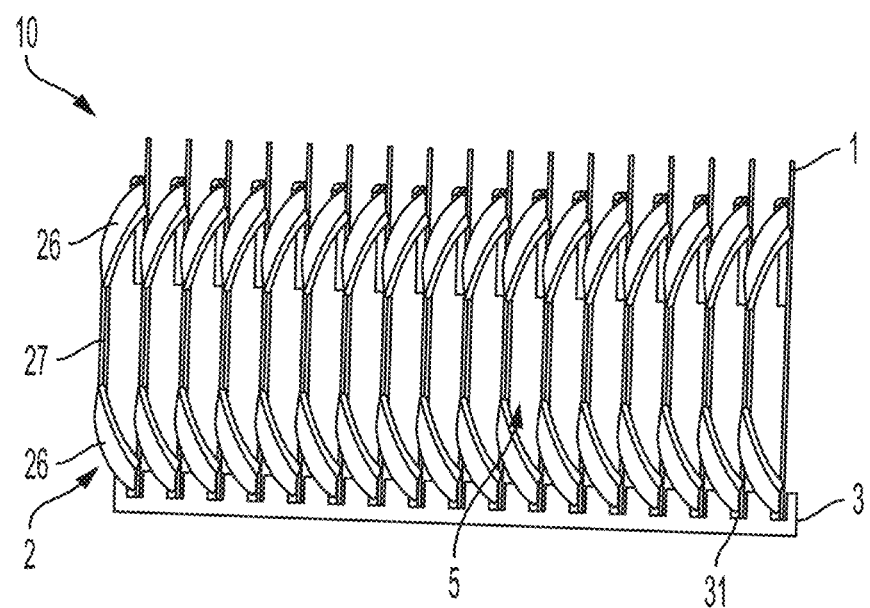
FIG. 12 is a side view of the FIG. 11 embodiment.

FIGS. 11 and 12 show an embodiment that is similar to that in FIGS. 4 and 7, except that parts of the tubes 2 between the first portion 21 and third/fourth portions 23, 24 and between the second portion 22 and the third/fourth portions 23, 24 include a twist and bend. A twist and bend arrangement may be useful when forming a tube 2 from a multiport tube that has a generally rectangular cross section that is relatively wide and flat (or thin), e.g., like that shown in FIG. 3. That is, bending a multiport tube that is relatively wide and flat to have bends as shown in FIGS. 1 and 4 may be difficult, may not be possible with certain tube materials or geometries, and/or may make some flow loops around the tube longer than others (e.g., inner loops may be unsuitably shorter than outer loops). By providing a twist and bend at transitions between tube portions, a multiport tube need not be bent entirely in the plane of its wide dimension as in FIGS. 1 and 4, and may allow for the use of tube materials and geometries that would otherwise not be possible. In the embodiment of FIGS. 11 and 12, the third and fourth portions 23 24 each have a pair of 180/90 degree twist-bends 26 with an intermediate part 27 between the 180/90 degree twist bends. A "180/90 degree twist bend" refers to a manipulation of the tube 2 in which the tube 2 is twisted 180 degrees relative to the tube's longitudinal axis and bent 90 degrees about an axis that is perpendicular or otherwise transverse to the tube's longitudinal axis. As can be seen in FIG. 12, the result of the twist bends is that the intermediate part 27 between the twist bends 26 is located out of the plane of the first face 16 of the fin 1 to which the first and second portions 21, 22 are attached, but lies in a plane that is parallel to the plane of the first face 16. In this embodiment, the intermediate parts 27 are arranged to lie generally in a plane of an adjacent fin 1 so that a gap 5 is provided between adjacent fins 1, e.g., allowing relatively unimpeded air flow through the gap 5. Of course, other arrangements are possible, as the intermediate part 27 need not necessarily lie in the plane of an adjacent fin 1.

Figure 13:
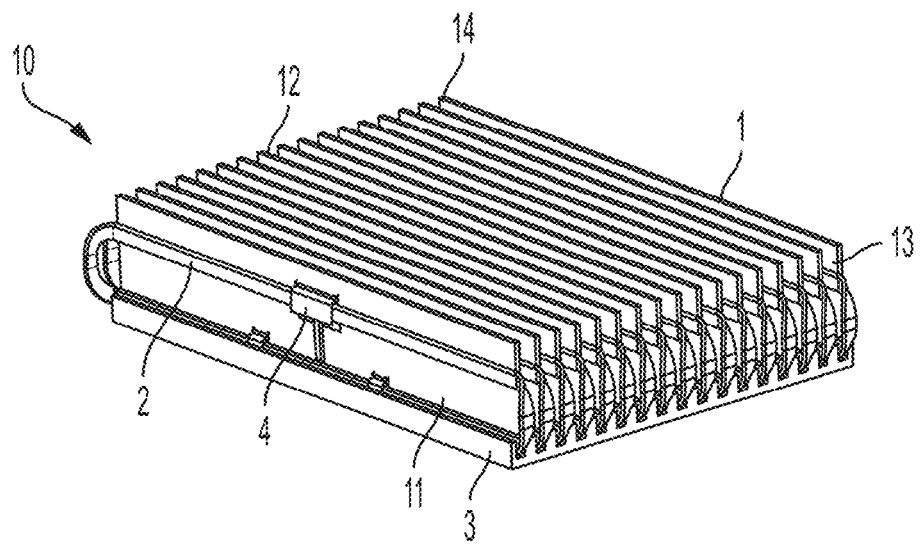
FIG. 13 is a perspective view of another heat transfer assembly including a plurality of fin and tube arrangements in which the tubes have twisted and bent side portions.
Figure 14:
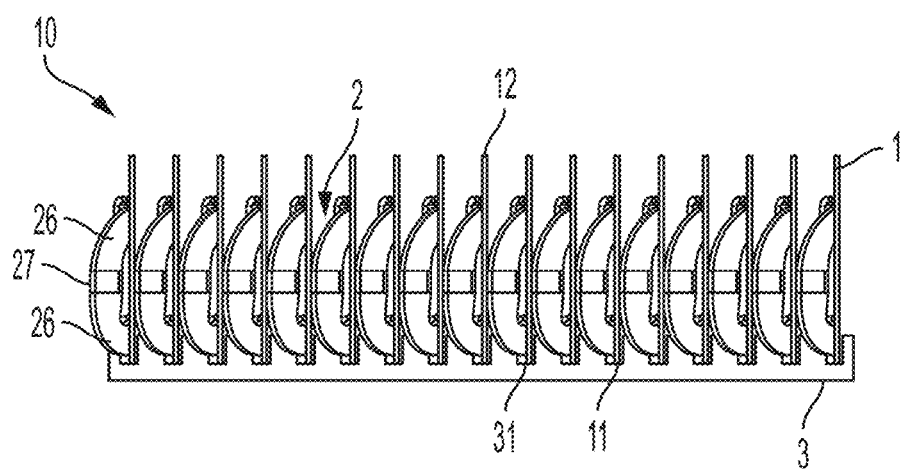
FIG. 14 is a side view of the FIG. 13 embodiment.

FIGS. 13 and 14 show another embodiment that is similar to that in FIGS. 11 and 12, except that the third and fourth portions 23, 24 of the tubes 2 each include a pair of 90/90 degree twist bends 26 and an intermediate part 27 between the twist bends 26. Similar to above, a "90/90 degree twist bend" refers to a manipulation of the tube 2 by which the tube 2 is twisted 90 degrees relative to the tube's longitudinal axis and bent 90 degrees about an axis that is perpendicular or otherwise transverse to the tube's longitudinal axis. The result is that the intermediate part 27 is arranged in a plane that is generally perpendicular to the plane of the first face 16 of the fin 1 to which the first and second portions 21, 22 are attached. As a result, the intermediate parts 27 may be positioned to generally occlude or block flow in any space between adjacent fins 1 at the third and fourth edges 13, 14 of the fins 1. Of course, air flow between fins 1 is unimpeded from along the second edge 12 of the fins 1.

Figure 15:
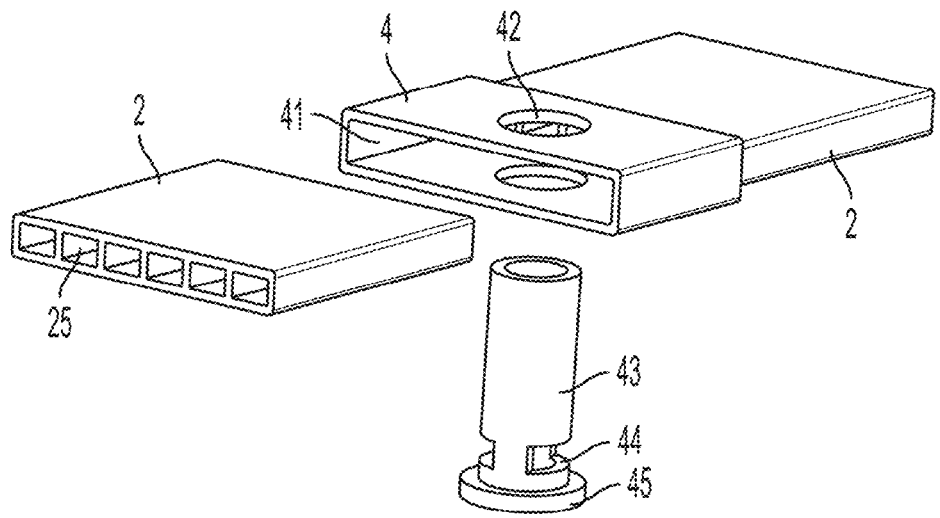
FIG. 15 is a perspective view of a manifold arrangement having a working fluid delivery port.
Figure 16:
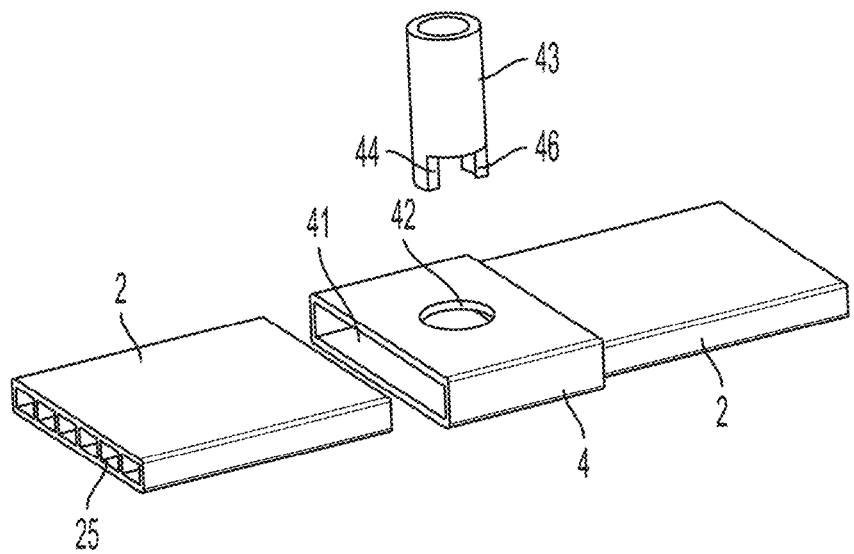
FIG. 16 is a perspective view of a manifold arrangement having another embodiment of a working fluid delivery port.

FIGS. 15 and 16 show embodiments of a coupling for joining opposite ends of a tube 2 as well as for providing a suitably sized manifold chamber 41 and a fill port 43 for providing working fluid to the tube 2. In FIG. 15, a coupling includes a generally tubular element sized to receive ends of the tube 2. The coupling has a hole 42 formed through the coupling so that a fill port 43 can be extended through the hole 42. A head 45 on the fill port 43 acts as a stop, preventing the fill port 43 from passing entirely through the hole 42 as well as properly positioning channels 44 within the manifold chamber 41 of the coupling. The fill port 43 may be secured in the hole 42 of the coupling, e.g., to provide a leak tight joint. Note that the part of the fill port 43 in the manifold chamber 41 acts as a stop for the tube ends, preventing the tube ends from being inserted into the manifold chamber 41 beyond the fill port 43. This may help ensure the tube ends are suitably engaged with the coupling as well as define the size of the manifold chamber 41. With the fill port 43 and tube ends secured to the coupling, e.g., by brazing, welding, adhesive, etc., working fluid may be provided into the tube 2 via the fill port 43 and the fill port 43 sealed, e.g., by crimping, a plug, welding, etc.

The embodiment of FIG. 16 operates similar to that in FIG. 15, but the coupling has only a single hole 42 in one side of the coupling rather than having a hole formed entirely through the coupling. The fill port 43 includes an end with two legs 46 that define channels 44. Thus, the fill port 43 can be inserted into the opening 42 until the legs 46 contact the inner side of the coupling, and then secured to the coupling. Again, the fill port 43 can act as a stop for the tube ends inserted into the coupling, defining a manifold chamber 41 size. Working fluid may be provided to the tube 2 via the fill port 43, which is then closed.

The embodiments provided herein are not intended to be exhaustive or to limit the invention to a precise form disclosed, and many modifications and variations are possible in light of the above teachings. The embodiments were chosen and described in order to best explain the principles of the invention and its practical application to thereby enable others skilled in the art to best utilize the invention in various embodiments and with various modifications as are suited to the particular use contemplated. Although the above description contains many specifications, these should not be construed as limitations on the scope of the invention, but rather as an exemplification of alternative embodiments thereof.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

The use of "including," "comprising," "having," "containing," "involving," and/or variations thereof herein, is meant to encompass the items listed thereafter and equivalents thereof as well as additional items.

It should also be understood that, unless clearly indicated to the contrary, in any methods claimed herein that include more than one step or act, the order of the steps or acts of the method is not necessarily limited to the order in which the steps or acts of the method are recited.

While aspects of the invention have been described with reference to various illustrative embodiments, such aspects are not limited to the embodiments described. Thus, it is evident that many alternatives, modifications, and variations of the embodiments described will be apparent to those skilled in the art. Accordingly, embodiments as set forth herein are intended to be illustrative, not limiting. Various changes may be made without departing from the spirit of aspects of the invention.

The invention claimed is:

1. A heat transfer device comprising:
a planar fin having first and second opposed faces and a heat receiving portion at an edge of the planar fin; and
at least one tube forming a continuous, closed loop and containing a working fluid, the at least one tube being physically and thermally connected to the first face of the planar fin, and the at least one tube and working fluid adapted to operate as a two-phase thermo siphon in which working fluid is evaporated in an evaporation portion of the at least one tube adjacent the heat receiving portion of the planar fin, and working fluid vapor flows in the at least one tube away from the evaporation portion for condensing, the at least one tube including a multiport tube having multiple flow channels forming the continuous closed loop, the multiport tube including a sleeve-type coupling that joins ends of the multiport tube to each other, the sleeve-type coupling including a sealable fill port for evacuating and/or providing the working fluid to the continuous, closed loop,
wherein the sealable fill port includes a tubular element attached to an opening in the sleeve-type coupling, and
wherein the tubular element provides a stop for tube ends received into the sleeve-type coupling.

2. The heat transfer device of claim 1, wherein the at least one tube is arranged to equalize a temperature of the planar fin at the heat receiving portion with temperatures of the planar fin in areas away from the heat receiving portion.

3. The heat transfer device of claim 1, wherein the multiport tube has a linear array of the flow channels, and wherein the multiport tube is attached to the first face of the planar fin such that each flow channel in the linear array is adjacent the first face.

4. The heat transfer device of claim 1, wherein the sleeve-type coupling is located on the continuous, closed loop where the working fluid is mostly in a liquid state.

5. The heat transfer device of claim 1, wherein the sleeve-type coupling is located on the continuous, closed loop where the working fluid is mostly in a vapor state.

6. The heat transfer device of claim 1, the planar fin includes an opening in which the sleeve-type coupling is positioned.

7. The heat transfer device of claim 1, wherein the at least one tube is adapted for flow of working fluid in only a single direction along the continuous, closed loop during operation.

8. The heat transfer device of claim 1, wherein the at least one tube is adapted for counterflow of working fluid in the continuous, closed loop during operation, wherein the counterflow may be in the form of the liquid phase of the working fluid flowing in a direction counter to that of the vapor phase of working fluid.

9. The heat transfer device of claim 1, wherein the planar fin has a rectangular shape with a first edge opposite a second edge and a third edge opposite a fourth edge, the heat receiving portion being at the first edge of the rectangular shape, and wherein the at least one tube has a first portion that extends outwardly along the first edge toward the third and fourth edges, third and fourth portions that respectively extend along the third and fourth edges toward the second edge, and a second portion extends inwardly along the second edge.

10. The heat transfer device of claim 9, wherein the second portion has parts that extend inwardly from the third and fourth portions along the second edge at an angle relative to the second edge such that a central part of the second portion is located closer to the second edge than outer parts of the second portion.

11. The heat transfer device of claim 9, wherein the second portion has parts that extend inwardly from the third and fourth portions along the second edge at an angle relative to the second edge such that a part of the second portion nearest the third portion is located closer to the second edge than a part of the second portion nearest the fourth portion.

12. The heat transfer device of claim 9, wherein the first portion at least in part defines the evaporation portion, and the at least one tube is arranged so that working fluid vapor flows in the at least one tube from the evaporation portion to the third portion and/or the fourth portion, and flows from the third portion and/or the fourth portion to the second portion.

13. The heat transfer device of claim 12, wherein the at least one tube is arranged such that condensed working fluid liquid flows in the at least one tube from the second portion to the third portion and/or the fourth portion, and from the third portion and/or the fourth portion to the first portion.

14. The heat transfer device of claim 9, further comprising a base that supports the planar fin and the at least one tube and transfers heat to the planar fin and the at least one tube.

15. The heat transfer device of claim 14, wherein the base includes a groove that receives at least a part of the first edge of the planar fin and the first portion of the at least one tube.

16. The heat transfer device of claim 1, wherein the at least one tube includes a first tube bonded to the first face of the planar fin, and a second tube bonded to the second face of the planar fin.

17. The heat transfer device of claim 1, wherein the planar fin includes an opening arranged to receive a portion of the at least one tube or other component, or arranged to permit air flow through the opening.

18. The heat transfer device of claim 1, wherein the planar fin includes an opening arranged to receive a portion of the sleeve-type coupling.

19. The heat transfer device of claim 1, wherein the sleeve-type coupling has an opening on only one side through which the tubular element extends.

20. The heat transfer device of claim 1, wherein the sleeve-type coupling has opposite ends each having an opening into which the ends of the multiport tube are respectively received, and wherein the sealable fill port is positioned between the ends of the multiport tube.

21. A heat transfer device comprising:
a planar fin having first and second opposed faces, a rectangular shape with a first edge opposite a second edge and a third edge opposite a fourth edge, and a heat receiving portion at the first edge of the rectangular shape; and
at least one tube forming a continuous, closed loop and containing a working fluid, the at least one tube being physically and thermally connected to the first face of the planar fin, and the at least one tube and working fluid adapted to operate as a two-phase thermo siphon in which working fluid is evaporated in an evaporation portion of the at least one tube adjacent the heat receiving portion of the planar fin, and working fluid vapor flows in the at least one tube away from the evaporation portion for condensing,
wherein the at least one tube has a first portion that extends outwardly along the first edge toward the third and fourth edges, third and fourth portions that respectively extend along the third and fourth edges toward the second edge, and a second portion extends inwardly along the second edge,
wherein the third and fourth portions each have at least one twist bend and the third and fourth portions are located away from the plane of the first face.

22. The heat transfer device of claim 21, wherein the third and fourth portions each have a pair of 180/90 degree twist bends with an intermediate part between the twist bends, wherein the intermediate part of the third and fourth portions is arranged in a plane parallel to the plane of the first face, or wherein the third and fourth portions each have a pair of 90/90 degree twist bends.

23. A heat transfer device comprising:
a planar fin having first and second opposed faces and a heat receiving portion at an edge of the planar fin; and
at least one tube forming a continuous, closed loop and containing a working fluid, the at least one tube being physically and thermally connected to the first face of the planar fin, and the at least one tube and working fluid adapted to operate as a two-phase thermo siphon in which working fluid is evaporated in an evaporation portion of the at least one tube adjacent the heat receiving portion of the planar fin, and working fluid vapor flows in the at least one tube away from the evaporation portion for condensing, the at least one tube including a multiport tube having multiple flow channels forming the continuous closed loop, the multiport tube including a sleeve-type coupling that joins ends of the multiport tube to each other, the sleeve-type coupling including a sealable fill port for evacuating and/or providing the working fluid to the continuous, closed loop,
wherein the sealable fill port includes a tubular element attached to an opening in the sleeve-type coupling, and
wherein the tubular element has a leg that defines a channel at an end of the tubular element, the leg being positioned against an inner wall of the sleeve-type coupling.

* * * * *